(12) United States Patent
Pirovano

(10) Patent No.: US 12,131,793 B2
(45) Date of Patent: Oct. 29, 2024

(54) TRIPLE MODULAR REDUNDANCY FOR FAULT-TOLERANT IN-MEMORY COMPUTING

(71) Applicant: Micron Technology, Inc., Boise, ID (US)

(72) Inventor: Agostino Pirovano, Milan (IT)

(73) Assignee: Micron Technology, Inc., Boise, ID (US)

( * ) Notice: Subject to any disclaimer, the term of this patent is extended or adjusted under 35 U.S.C. 154(b) by 236 days.

(21) Appl. No.: 17/609,577

(22) PCT Filed: Oct. 13, 2020

(86) PCT No.: PCT/IB2020/020060
§ 371 (c)(1),
(2) Date: Nov. 8, 2021

(87) PCT Pub. No.: WO2022/079463
PCT Pub. Date: Apr. 21, 2022

(65) Prior Publication Data
US 2022/0310195 A1     Sep. 29, 2022

(51) Int. Cl.
| | | |
|---|---|---|
| *G11C 16/04* | (2006.01) | |
| *G11C 11/00* | (2006.01) | |
| *G11C 16/08* | (2006.01) | |
| *G11C 16/10* | (2006.01) | |
| *G11C 16/24* | (2006.01) | |

(Continued)

(52) U.S. Cl.
CPC ............ *G11C 29/789* (2013.01); *G11C 16/08* (2013.01); *G11C 16/102* (2013.01); *G11C 16/24* (2013.01); *G11C 29/52* (2013.01)

(58) Field of Classification Search
CPC .............. G11C 16/102; G11C 13/0004; G11C 13/0069; G11C 29/52; G11C 16/24; G11C 16/08; G11C 29/789
See application file for complete search history.

(56) References Cited

U.S. PATENT DOCUMENTS

| | | |
|---|---|---|
| 7,620,883 B1 | 11/2009 | Carmichael et al. |
| 2011/0075474 A1* | 3/2011 | Kim ................... G11C 13/0061 |
| | | 365/163 |

(Continued)

FOREIGN PATENT DOCUMENTS

TW          201805952 A     2/2018

OTHER PUBLICATIONS

Taiwanese Patent Office, "Office Action and Search Report", issued in connection with Taiwanese Patent Application No. 110134750 dated Aug. 12, 2022 (16 pages).

(Continued)

*Primary Examiner* — Hien N Nguyen
(74) *Attorney, Agent, or Firm* — Holland & Hart LLP

(57) ABSTRACT

Methods, systems, and devices related to 3D self-selecting-memory array of memory cells are described. The method relates to a solution for improving the fault-tolerant capability of memory devices, including: applying a triple-modular-redundancy calculation in a programming phase of the memory cells of a memory array, and adopting a sequence of two opposite dual polarity algorithms applied along a selected bit line and in parallel on the at least three selected word lines of the memory array.

12 Claims, 13 Drawing Sheets

(51) Int. Cl.
    *G11C 29/00*       (2006.01)
    *G11C 29/52*       (2006.01)

(56) References Cited

U.S. PATENT DOCUMENTS

| | | | |
|---|---|---|---|
| 2011/0261633 A1* | 10/2011 | Chandra | G11C 8/08 |
| | | | 365/189.011 |
| 2012/0198313 A1 | 8/2012 | Alam et al. | |
| 2014/0233299 A1 | 8/2014 | Lan et al. | |
| 2017/0162585 A1 | 6/2017 | Or-Bach et al. | |
| 2019/0198105 A1 | 6/2019 | Pirovano | |
| 2019/0287586 A1* | 9/2019 | Wolff | G11C 29/00 |
| 2022/0214943 A1 | 7/2022 | Chih et al. | |
| 2022/0392535 A1* | 12/2022 | Sarpatwari | G11C 16/24 |
| 2023/0343397 A1* | 10/2023 | Hsu | G11C 16/32 |

OTHER PUBLICATIONS

"International Search Report and Written Opinion of the International Searching Authority," issued in connection with Int'l Appl. No. PCT/IB2020/020060, dated Jul. 9, 2021 (14 pages).

\* cited by examiner

| $q_1$ | $q_2$ | $q_3$ | Voter |
|---|---|---|---|
| 0 | 0 | 0 | 0 |
| 0 | 0 | 1 | 0 |
| 0 | 1 | 0 | 0 |
| 1 | 0 | 0 | 0 |
| 0 | 1 | 1 | 1 |
| 1 | 0 | 1 | 1 |
| 1 | 1 | 0 | 1 |
| 1 | 1 | 1 | 1 |

TMR ALGORITHM

| Input | | | Pre | | Intermediate | | | Post | | Output | | |
|---|---|---|---|---|---|---|---|---|---|---|---|---|
| $q_1$ | $q_2$ | $q_3$ | BL1 current | 2nd pulse | $q_1$ | $q_2$ | $q_3$ | BL1 current | 2nd pulse | $q_1$ | $q_2$ | $q_3$ |
| 0 | 0 | 0 | $3I_{sel}$ | N | 0 | 0 | 0 | 0 | Y | 0 | 0 | 0 |
| 0 | 0 | 1 | $2I_{sel}$ | N | 0 | 0 | 1 | $I_{sel}$ | Y | 0 | 0 | 0 |
| 0 | 1 | 0 | $2I_{sel}$ | N | 0 | 1 | 0 | $I_{sel}$ | Y | 0 | 0 | 0 |
| 1 | 0 | 0 | $2I_{sel}$ | N | 1 | 0 | 0 | $I_{sel}$ | Y | 0 | 0 | 0 |
| 0 | 1 | 1 | $I_{sel}$ | Y | 1 | 1 | 1 | $3I_{sel}$ | N | 1 | 1 | 1 |
| 1 | 0 | 1 | $I_{sel}$ | Y | 1 | 1 | 1 | $3I_{sel}$ | N | 1 | 1 | 1 |
| 1 | 1 | 0 | $I_{sel}$ | Y | 1 | 1 | 1 | $3I_{sel}$ | N | 1 | 1 | 1 |
| 1 | 1 | 1 | 0 | Y | 1 | 1 | 1 | $3I_{sel}$ | N | 1 | 1 | 1 |

FIG. 16

TMR ALGORITHM + WL snap detector

| Input | | | Pre | | Intermediate | | | Post | | Output | | |
|---|---|---|---|---|---|---|---|---|---|---|---|---|
| $q_1$ | $q_2$ | $q_3$ | BL1 current | 2nd pulse | $q_1$ | $q_2$ | $q_3$ | BL1 current | 2nd pulse | $q_1$ | $q_2$ | $q_3$ |
| 0 | 0 | 0 | $3I_{sel}$ | N | 0 | 0 | 0 | 0 | N | 0 | 0 | 0 |
| 0 | 0 | 1 | $2I_{sel}$ | N | 0 | 0 | 1 | $I_{sel}$ | Y-WL3 | 0 | 0 | 0 |
| 0 | 1 | 0 | $2I_{sel}$ | N | 0 | 1 | 0 | $I_{sel}$ | Y-WL2 | 0 | 0 | 0 |
| 1 | 0 | 0 | $2I_{sel}$ | N | 1 | 0 | 0 | $I_{sel}$ | Y-WL1 | 0 | 0 | 0 |
| 0 | 1 | 1 | $I_{sel}$ | Y-WL1 | 1 | 1 | 1 | $3I_{sel}$ | N | 1 | 1 | 1 |
| 1 | 0 | 1 | $I_{sel}$ | Y-WL2 | 1 | 1 | 1 | $3I_{sel}$ | N | 1 | 1 | 1 |
| 1 | 1 | 0 | $I_{sel}$ | Y-WL3 | 1 | 1 | 1 | $3I_{sel}$ | N | 1 | 1 | 1 |
| 1 | 1 | 1 | 0 | N | 1 | 1 | 1 | $3I_{sel}$ | N | 1 | 1 | 1 |

FIG. 17

TRIPLE MODULAR REDUNDANCY FOR FAULT-TOLERANT IN-MEMORY COMPUTING

CROSS-REFERENCE

The present application for patent is a 371 national phase filing of International Patent Application No. PCT/IB2020/020060 by Pirovano, entitled "TRIPLE MODULAR REDUNDANCY FOR FAULT TOLERANT IN-MEMORY COMPUTING", filed Oct. 13, 2020, which is assigned to the assignee hereof and which is expressly incorporated by reference in its entirety.

TECHNICAL FIELD

The present disclosure relates generally to semiconductor memory and methods, and more particularly, to a smart implementation of a triple-modular-redundancy for 3D vertical cross point memory device for fault-tolerant in-memory computing.

BACKGROUND

Memory devices are typically provided as internal, semiconductor, integrated circuits and/or external removable devices in computers or other electronic devices. There are many different types of memory including volatile and non-volatile memory. Volatile memory can use power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), and magnetic random access memory (MRAM), among others.

Memory devices can be utilized as volatile and non-volatile memory for a wide range of electronic applications that may use high memory densities, high reliability, and low power consumption. Non-volatile memory may be used in, for example, personal computers, portable memory sticks, solid state drives (SSDs), personal digital assistants (PDAs), digital cameras, cellular telephones, portable music players, for example, MP3 players, and movie players, among other electronic devices. Data, such as program code, user data, and/or system data, such as a basic input/output system (BIOS), are typically stored in non-volatile memory devices.

Resistance variable memory such as PCRAM includes resistance variable memory cells that can store data based on the resistance of a storage element (e.g., a storage element having a variable resistance). As such, resistance variable memory cells can be programmed to store data corresponding to a target state by varying the resistance level of the resistance variable storage element. Resistance variable memory cells can be programmed to a target state (e.g., logical state) corresponding to a particular resistance, by applying sources of an electrical field or energy, such as positive or negative electrical signals (e.g., positive or negative voltage or current signals) to the cells.

Various computing architectures (e.g., Von Neumann architectures) include a bottleneck issue associated with data transfer between memory (e.g., a memory device storing data) and a processing resource (e.g., a central processing unit) used to perform compute functions on data (e.g., via logical operations such as Boolean logic operations and/or higher level mathematical operations) in association with executing instructions (e.g., a program). Some memory devices are capable of in-memory computing, which can include performing logical operations between data values stored in a memory array without transferring the data out of the array (e.g., to an external processing resource).

BRIEF DESCRIPTION OF THE DRAWINGS

FIG. 16 and FIG. 17 represent comparison tables reporting the differences between a triple modular redundancy applied without or with snap detector in accordance with a number of examples of the present disclosure;

DETAILED DESCRIPTION

Figure 1A:
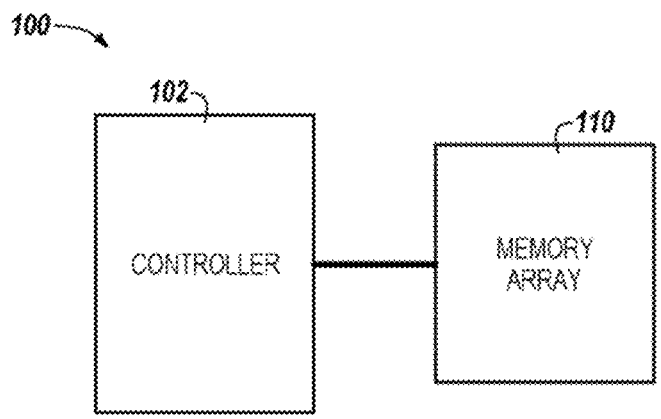
FIG. 1A illustrates a memory system capable of performing material implication operations in accordance with a number of examples of the present disclosure.

The present disclosure includes improved apparatuses and methods for material implication operations in memory, and more particularly, a smart implementation of a triple-modular-redundancy for a memory device, such as a 3D vertical cross point memory, for fault-tolerant in-memory computing.

In some cases, in-memory computing (IMC) using 3D vertical cross point memory device may include an apparatus that may include a plurality of memory cells coupled to a first access line (e.g., word line) and a plurality of second access lines (e.g., bit lines), and a controller configured to apply a first signal to the first access line, and while the first signal is being applied to the first access line, apply a second signal to a first of the plurality of memory cells via one of the plurality of second access lines and apply a third signal to a second of the plurality of memory cells via another one of the plurality of second access lines. The material implication operation may be performed as a result of the signals (e.g., first, second, and third signals) applied and a result of the material implication operation may be stored on the second of the plurality of memory cells subsequent to the application of the third signal.

This example provides various benefits such as reduced cost associated with a memory device capable of performing various In-memory computing operations (e.g., Boolean logical operations) compared to previous approaches. For example, it may simplify a circuit design for a memory array that is capable of performing a material implication operation within the memory array (e.g., without transferring data associated with the material implication out of the memory array). For example, the ability to perform a material implication operation in memory along with the ability to perform a FALSE operation (e.g., an operation resulting in logic "0") in memory form a computationally complete logic basis. As such, any Boolean logical operation (e.g., AND, OR, NAND, NOR, XOR, COPY, and/or NOT) may be derived by suitably combining performance of material implication and FALSE operations.

In some cases, IMC operations may be performed without having to read data values from an array into sense amplifiers, for example, which can result in consuming less power as compared to various previous approaches.

Although the several advantages related to the above described IMC in 3D self-selecting devices, it should be noted that any IMC system based on material implication poses a fundamental problem for error management and fault tolerant computation.

As in logic operation in standard CPU, in IMC operations (both material implication and FALSE operation) there exist a probability for computational errors to happen. Despite several techniques for detecting, reporting and correcting computational errors have been developed for CPU-based systems, the fault tolerant computation in IMC have received minor attention.

In standard memory applications, e.g., DRAM or NAND memories, the data integrity is usually achieved with the adoption of Error Correction Techniques (ECC). But standard ECC techniques employed in legacy memory applications cannot be used in IMC because the integrity of an ECC encoded codeword (e.g., with parity bit or Hamming codes) would be corrupted through the application of material implication operator and ECC codes are not preserved by Boolean operations.

To enable IMC operation with sufficient error immunity, the present disclosure proposes to adopt a fault-tolerant IMC approach implementing an embedded Triple-Modular-Redundancy operation. Let's see in more details the methodology proposed by the present disclosure. Extension to more than Triple-Modular-Redundancy, e.g., Multiple-Modular-Redundancy operation, is possible.

The idea at the basis of the present disclosure starts from the consideration that Lockstep systems are fault-tolerant computer systems that run the same set of operations at the same time in parallel on more than one system and where the operation redundancy allows error detection and error correction.

If there are at least two systems running in parallel the same set of operations at the same time (dual modular redundancy), the output from lockstep operations can be compared to determine if there has been a fault situation, i.e., a mismatch of the results of the operations performed independently on the two systems. This comparison may be called detection.

However, if there are at least three systems, that is to say: a Triple Modular Redundancy (TMR), the error can be automatically corrected via majority vote.

In TMR, three identical logic circuits, for instance three logic gates, are used to compute the same set of specified Boolean function. If there are no circuit failures, the outputs of the three circuits are identical; but in case of circuit failures, the outputs of the three circuits may be different.

According to examples of the present disclosure, the TMR methodology is applied to build a fault-tolerant IMC system, in particular for 3D vertical cross point memory devices.

According to examples of the present disclosure a smart implementation of the TMR concept is combined with the specific structure and properties of the 3D vertical cross point memory devices and with the IMC implementation based on material implication operations.

In detail:

TMR is implemented by replicating each data on three different word lines WLs that share the same bit lines BL Parallel computation is performed by applying the IMP operation on the three word lines WLs, implementing the TMR-IMP algorithm Finally, a TMR correction is implemented through a sequence of specific programming pulses specifically intended for 3D memory device further combined with the usage of a current comparator circuit defined as SMART-TMR algorithm.

Some advantages of this proposal may include:

Capability to implement TMR exploiting 3D memory cells unique features;

Simpler implementation than standard TMR with external majority voter; and

Capability to detect and correct errors, thus refreshing the data integrity in the memory during complex IMC operations.

Let's see in more details how this Triple-Modular-Redundancy method may be applied to the 3D memory devices.

As used herein, a material implication operation is a valid rule of replacement that allows for a conditional statement to be replaced by a disjunction (e.g., OR), in which the antecedent is negated (e.g., NOT). For example, the operation may state that "p" implies "q" (e.g., in which "p" is an antecedent and "q" is a consequent) is logically equivalent to (not-p) OR q. As used herein, a material implication operation may be represented as "IMP". For example, performing a material implication operation on an antecedent "p" and a consequent "q" may be represented as pIMPq.

Material implication in 3D memory devices among two bits p and q placed on the same word line WL and along bit lines BL1 and BL2, respectively, can be realized by applying a suitable pulse sequence as reported in passages of the Figures from 2A to 5B.

The basic idea is a two steps algorithm. In the first step the selected word line WL is turned on by the WL driver while the bit line BL1 is biased. The total bias across the first cell is equal to Vread. Depending on the Vth state of p, the cell may turn on. In this case the voltage drop across the cell lowers to Vhold, so the local WL voltage raises.

The second stage of the algorithm corresponds to the application of the other bit line BL2 voltage on q. If p is not switched on, the voltage drop across q is equal to Vprog and the q cell is programmed in the low Vth state. If p has been switched on, the local WL voltage is higher and the voltage drop across q is reduced from Vprog to around Vread, so the content of q is not affected.

At the end of the pulses, the q cell content has been changed in the result of pIMPq.

In the following detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and structural changes may be made without departing from the scope of the present disclosure.

As used herein, designators such as "N" and "M", particularly with respect to reference numerals in the drawings, indicate that a number of the particular feature so designated can be included. It is also to be understood that the terminology used herein is for the purpose of describing particular examples only, and is not intended to be limiting. As used herein, the singular forms "a", "an", and "the" can include both singular and plural referents, unless the context clearly dictates otherwise. In addition, "a number of" something (e.g., a number of memory cells) can refer to one or more of such things, where a "plurality of" is intended to refer to more than one of such things (e.g., more than one memory cell). Furthermore, the words "can" and "may" are used throughout this application in a permissive sense (e.g., having the potential to, being able to), not in a mandatory sense (e.g., required to).

The figures herein follow a numbering convention in which the first digit or digits correspond to the drawing figure number and the remaining digits identify an element or component in the drawing. Similar elements or components between different figures may be identified by the use of similar digits. For example, 114 may reference element "14" in FIG. 1, and a similar element may be referenced as 314 in FIG. 3.

FIG. 1A illustrates a memory system 100 capable of performing material implication operations in accordance with a number of examples of the present disclosure. As shown in FIG. 1A, the memory system 100 includes a controller 102 and a memory array 110.

The controller 102 can communicate with the memory array 110 to perform memory operations such as read, write, and/or erase operations, and logical operations (e.g., Boolean operations including IMP, NAND, NOR, XOR, COPY, NOT, AND, and/or OR, among other operations). As an example, the controller 102 can be on a same die or a different die than a die or dice corresponding to the memory array 110. The controller 102 can include, for example, a number of components in the form of hardware and/or firmware (e.g., one or more integrated circuits) and/or software for controlling access to the memory array 110 and/or for facilitating data transfer between the memory array 110 and a requesting device (e.g., host, not shown, but which may be coupled to the memory system 100).

The controller 102 is capable of providing signals to array 110 to perform memory operations such as reads and writes. In a number of examples, the controller 102 may be configured to provide signals to the array 110 to perform In-memory computing operations such as material implication operations and/or other Boolean logic operations as described further herein.

The memory array 110 may serve as a memory for the memory system 100. The memory array 110 may include memory cells that are resistance variable memory cells. For example, states (e.g., logical states) of the memory cells may be determined based on resistance (e.g., corresponding voltages) or threshold switching (e.g., low and high threshold switching voltage) of the memory cells that are variable responsive to voltages applied across the memory cells. As described further herein, the memory cells of the memory array 110 may be capable of storing a value corresponding to an antecedent, a value corresponding to a consequent, and a value corresponding to a result of a material implication operation, which may be performed within the memory array 110.

Figure 1B:
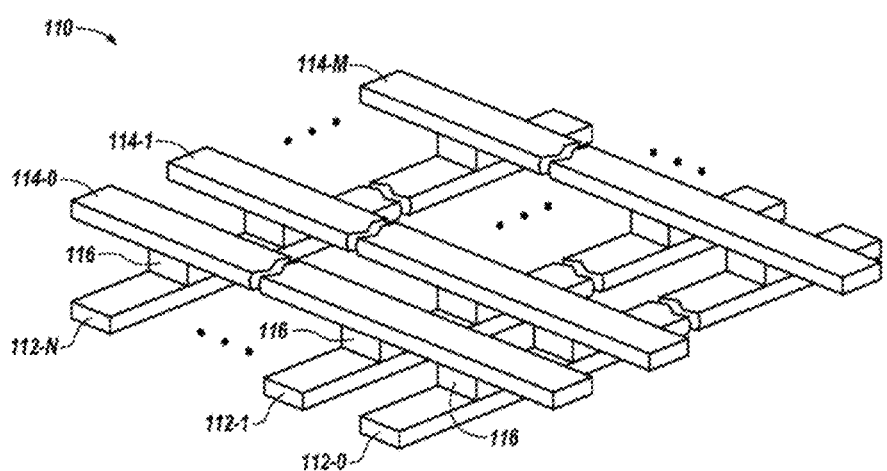
FIG. 1B illustrates an example of a memory array capable of storing data values on which material implication operations can be performed in accordance with a number of examples of the present disclosure.

FIG. 1B illustrates an example of a memory array 110 capable of storing data values on which material implication operations can be performed in accordance with a number of examples of the present disclosure. The example shown in FIG. 1B is a 3D cross-point memory array; however, examples are not so limited. Memory array 110 includes a plurality of access lines 112-0 to 112-N (e.g., which may be referred to as word lines 112), and a plurality other access lines 114-0 to 114-M (e.g., which may be referred to as bit lines 114) that cross each other (e.g., intersect in different planes). Memory cells 116 are located at intersections of the word lines 112 and the bit lines 114 (e.g., at each bit line/word line crossing). Although in FIG. 1B, the access lines 112 are word lines and the access lines 114 are bit lines, in a number of examples, the access lines 112 may be bit lines and the access lines 114 may be word lines.

The memory cells 116, for example, can be non-volatile resistance variable memory cells each having an associated select element and a storage element. The select elements in each resistance variable memory cells can be operated (e.g., turned on/off) to select the memory cells in order to perform operations such as data programming and/or data reading operations on the resistance variable memory cells. Although the array 110 is shown as a two-dimensional (2D)

arrangement, in various examples, the array 110 may also be a three-dimensional (3D) cross-point array, which may include multiple tiles of array 110 stacked (e.g., vertically) on each other. Alternative examples of 3D memory arrays are possible; for example (not shown), so called 3D vertical memory arrays may include memory cells at crossing of vertical access lines, such as bit line pillars, and horizontal access lines, such as word lines, at a number of planes or decks.

As used herein, a storage element refers to a programmable portion of a resistance variable memory cell. For example, in PCRAM and RRAM cells, a storage element can include the portion of the memory cell having a resistance that is programmable to data states responsive to applied programming signals (e.g., voltage and/or current pulses), for example. The storage element can include a resistance variable material such as a phase change material (e.g., phase change chalcogenide alloy) such as an indium (In)-antimony(Sb)-tellurium(Te) (IST) material, e.g., In2Sb2Te5, In1Sb2Te4, In1Sb4Te7, etc., or a germanium-antimony-tellurium (GST) material, e.g., a Ge—Sb—Te material such as Ge2Sb2Te5, Ge1Sb2Te4, Ge1Sb4Te7, etc. The hyphenated chemical composition notation, as used herein, indicates the elements included in a particular mixture or compound, and is intended to represent all stoichiometries involving the indicated elements. Other phase change materials can include GeTe, In—Se, Sb2Te3, GaSb, InSb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other phase change materials.

The select element can also be a chalcogenide material such as those described above. While the select element and the storage element may include different chalcogenide materials, examples are not so limited. For example, each cell may include a material (e.g., a chalcogenide material) that can serve as both the storage element and the select element, with the cells being referred to as SSM (Self-Select Memory) cells. Example threshold voltage (Vt) distributions and current-versus-voltage signatures for SSM cells are described further below (e.g., in association with FIGS. 2A and 2B).

Figure 2A:
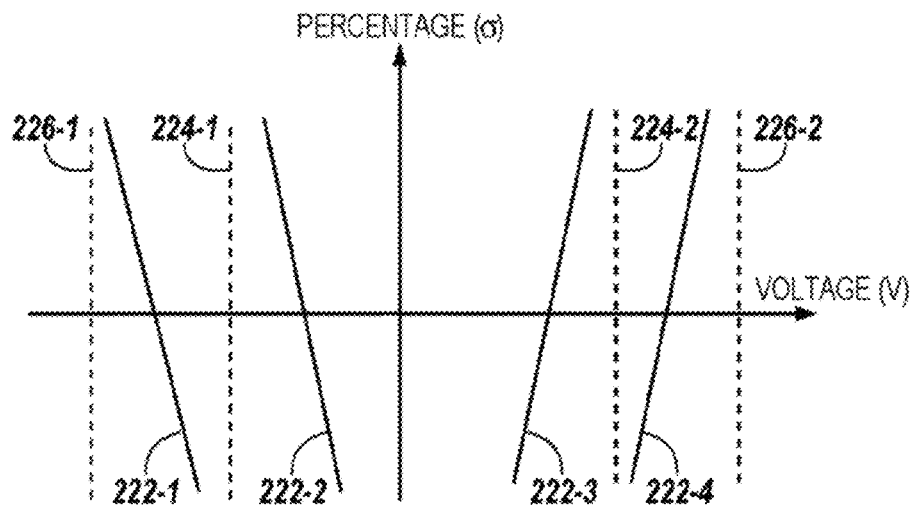
FIG. 2A illustrates threshold voltage distributions associated with states of memory cells on which material implication operations can be performed in accordance with a number of examples of the present disclosure.

FIG. 2A illustrates threshold voltage distributions associated with states of memory cells on which material implication operations can be performed in accordance with a number of examples of the present disclosure. In this example, the memory cells are SSM cells with the voltage distributions 222-1, 222-2, 222-3, and 222-4 corresponding to respective threshold voltage states, which may be referred to collectively as distributions 222 or states 222. The distributions 222 represent a statistical variation in the voltages of memory cells programmed to a particular state (e.g., logical state). As described further herein, the voltage distributions 222 may correspond to programmed states achieved via particular voltage differentials applied to (e.g., across) the memory cells (e.g., via applied voltage differentials between word lines such as word lines 112 and bit lines such as bit lines 114). As used herein, a voltage differential applied across a memory cell may be referred to as a memory cell voltage (VCELL) such as the difference between a word line voltage (e.g., voltage applied to a memory via one of the access lines 112) and a bit line voltage (e.g., voltage applied to the memory cell via corresponding one of the access lines 114).

FIG. 2A shows four different voltage distributions 222-1, 222-2, 222-3, and 222-4, which may represent four different states of memory cells. For example, although examples are not so limited, a voltage distribution 222-1 may represent a set state (e.g., "1"), a voltage distribution 222-2 may represent a reset state (e.g., "0"), a voltage distribution 222-3 may represent a set state (e.g., "1"), and a voltage distribution 222-4 may represent a reset state (e.g., "0").

FIG. 2A shows two different read voltages 224-1 and 224-2 used to distinguish cell states (e.g., logical states). For example, read voltage 224-1 can be used to determine whether a cell is programmed to state 222-1 or 222-2, and read voltage 224-2 can be used to determine whether a cell is programmed to state 222-3 or 222-4. As shown in FIG. 2A, an absolute value (e.g., magnitude) of each voltage 224-1 and 224-2 may be higher than one of the respective voltage distributions and lower than another one of the respective voltage distributions. For example, the magnitude of the voltage 224-1 may be higher than the voltage distribution 222-2 (e.g., representative of a reset state "0") and lower than the voltage distribution 222-1 (e.g., representative of a set state "1"). For example, the magnitude of the voltage 224-2 may be higher than the voltage distribution 222-3 (e.g., representative of a set state "1") and lower than the voltage distribution 222-4 (e.g., representative of a reset state "0").

The voltages 224 may be utilized to distinguish those memory cells in one state (e.g., set state) corresponding to the voltage distribution 222-1 from memory cells in another state (e.g., reset state) corresponding to the voltage distribution 222-2. For example, a voltage 224-2 may be utilized to distinguish those memory cells in one state (e.g., set state) corresponding to the voltage distribution 222-3 from memory cells in another state (e.g., reset state) corresponding to the voltage distribution 222-4. Logical states (e.g., set and reset states) of memory cells may be determined based on VCELL the memory cells exhibit subsequent to applying the voltages 224, which is further described in connection with FIG. 2B and FIG. 2C. As used herein, the voltages 224 may be referred to as read voltages (e.g., VREAD), which correspond to voltage differentials applied across memory cells to determine their logic state during a read operation.

As shown in FIG. 2A, the read voltages 224-1 and 224-2 have different polarities. In this example, the voltage 224-1 is a negative voltage and the voltage 224-2 is a positive voltage. As used herein, the polarity of a voltage can be based on a word line versus bit line differential (e.g., whether a bit line voltage is greater or less than a word line voltage).

Memory cells (e.g., memory cells 116) may be read using a read voltage having the same polarity as that of the Vt of the memory cells. For example, a memory cell having a negative Vt (e.g., corresponding to the voltage distributions 222-1 and 222-2) may be read using the voltage 224-1 having a negative polarity, and a memory cell having a positive Vt (e.g., corresponding to the voltage distributions 222-3 and 222-4) may be read using the voltage 224-2 having a positive polarity. However, examples are not so limited. For example, in performing a material implication operation, a read voltage having a positive polarity may be applied to a memory cell regardless of a state (e.g., logical state) of the memory cell. The positive read voltage may be used (e.g., applied across) to read a memory cell that may have a negative Vt. (e.g., programmed to a set state "1" by applying a voltage 226-1).

The memory cells (e.g., memory cells 116) that are read via the read voltages 224 having the same polarity as the memory cell Vts may exhibit, when read, the same voltage to which the memory cells are previously programmed independent of the number of times those are read. For example, the read is a non-destructive read (e.g., the logic state of the cell is maintained even if the magnitude of the read voltage 224 exceeds a Vt of the memory cell being read). In a number of examples, a FALSE operation may be performed as a result of programming the memory cells to a reset state (e.g., "0" by applying the program voltage 226-2). For example, regardless of input of the FALSE operation, an output (e.g., values stored on the memory cells programmed to a reset state) may be "0", which indicates FALSE.

FIG. 2A shows two different voltages 226-1 that may be utilized to program memory cells to a particular logical state (e.g., "0" or "1"). For example, a memory cell may be programmed to a set state (e.g., "1") by applying a voltage 226-2 and to a reset state (e.g., "0") by applying a voltage 226-1 across the memory cell. As used herein, the voltages 226 may be referred to as program voltages and applying the voltages 226 to program memory cells to particular logical states may be referred to as a program operation.

The voltage 226-1 may have a different polarity as the polarity of the voltage 226-2. For example, as shown in FIG. 2A, the voltage 226-1 may have a negative polarity and the voltage 226-2 may have a positive polarity. Memory cells may be programmed to a set state (e.g., "1") by applying voltage 226-2 having a positive polarity and to a reset state (e.g., "0") by applying voltage 226-1 having a negative polarity.

Figure 2B:
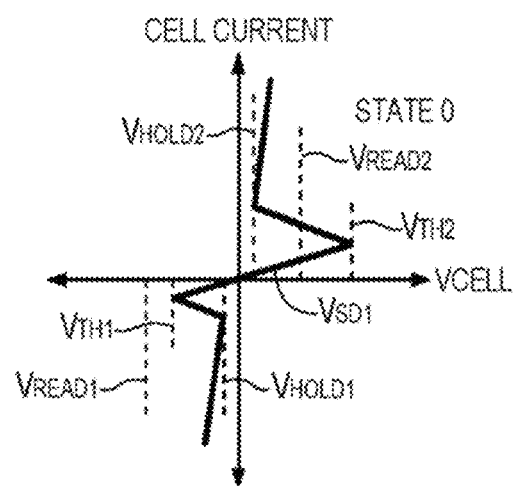
FIGS. 2B-2C are graphs illustrating current-versus-voltage signatures associated with memory cells on which material implication operations can be performed in accordance with a number of examples of the present disclosure.
Figure 2C:
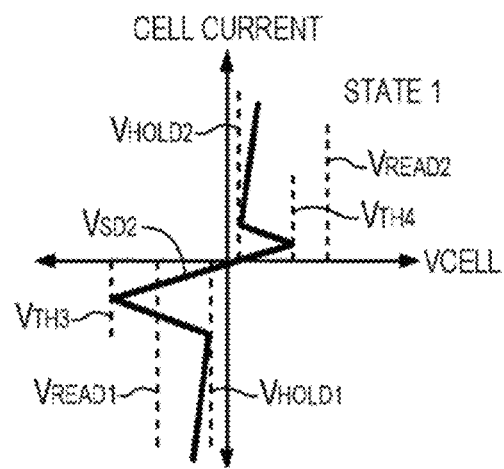

FIGS. 2B-2C are graphs illustrating current-versus-voltage signatures associated with memory cells on which material implication operations can be performed in accordance with a number of examples of the present disclosure. VCELL, as illustrated in FIGS. 2B and 2C, may represent the voltage differential (e.g., a difference between a bit line voltage and a word line voltage) as described in connection with FIG. 2A. Cell current, as illustrated in FIG. 2B, may represent a current flowing through a memory cell when a corresponding voltage is applied across the memory cell.

FIG. 2B shows a current-versus-voltage graph of a memory cell programmed to a reset state (e.g., "0"). A memory cell having a positive polarity Vt may be in a non-conductive state (e.g., higher resistance) until VCELL reaches threshold voltage (VTH2), at which point the memory cell switches (e.g., transitions via a "snapback" event) to a conductive state (e.g., lower resistance). As used herein, those different resistance may be referred to as resistance states (e.g., either conductive or non-conductive state). As such, when the positive voltage applied across the memory cell exceeds the threshold voltage (VTH2), the memory cell switches to a conductive state from a non-conductive state. Subsequent to switching from a non-conductive state to a conductive state, VCELL may remain at a hold voltage (VHOLD2), which is lower than the threshold voltage (VTH2). Similarly, when a negative voltage, whose absolute value (e.g., magnitude) exceeds an absolute value of the threshold voltage (VTH1), is applied across the memory cell, the cell switches from a non-conductive state to a conductive state and remains at a hold voltage (VHOLD1).

FIG. 2C shows a current-versus-voltage graph of a memory cell programmed to a set state (e.g., "1"). A memory cell having a negative polarity Vt, may be in a non-conductive state (e.g., higher resistance) until VCELL reaches threshold voltage (VTH3), at which point the memory cell switches to a conductive state. As such, when the negative voltage (e.g., applied across the memory cell) whose absolute value exceeds the threshold voltage (VTH3), the memory cell switches to a conductive state from a non-conductive state. Subsequent to switching from a non-conductive state to a conductive state, VCELL may remain at a VHOLD1, which is lower than the threshold voltage (VTH3). Similarly, when the positive voltage (e.g., applied across the memory cell) whose absolute value exceeds an absolute value of the threshold voltage (VTH4), the memory cell switches from a non-conductive state to a conductive state and remains at a VHOLD2.

In a number of examples, the memory cells (e.g., self-selecting-memory SSM) of the present disclosure may have particular switching characteristics. As an example, the magnitudes of the threshold voltages of a memory cell (e.g., one of the memory cells 116) in a particular state may be asymmetric for different polarities, as shown in FIGS. 2B and 2C. For example, a magnitude of the threshold voltage VTH1 may be lower than that of the threshold voltage VTH3, and a magnitude of the threshold voltage VTH4 may be lower than that of the threshold voltage VTH2.

As such, in some examples, a read voltage (e.g., read voltages 224) applied to a memory cell Vt having a magnitude greater than a corresponding threshold voltage may switch a resistance state (e.g., from a non-conductive state to a conductive state) of the memory cell. For example, the read voltage 224-2 (VREAD2), when applied, may switch a memory cell (e.g., programmed to a logical state "1" as shown in FIG. 2C) from a non-conductive state to a conductive state because the memory cell has a threshold voltage VTH4 lower than VREAD2. For example, the read voltage 224-1 (VREAD1), when applied, may switch a memory cell (e.g., programmed to a logical state "0" as shown in FIG. 2B) from a non-conductive state to a conductive state because the memory cell has a threshold voltage VTH1 (e.g., whose absolute value is) lower than VREAD1.

Logical states of memory cells whose states are changed from a non-conductive state to a conductive state due to an application of read voltage (e.g., VREAD1 and VREAD2) may not be changed in some circumstances. As described in connection with FIG. 2A, a logical state of memory cell may be determined based on whether VCELL (e.g., subsequent to applying a corresponding read voltage VREAD1 and VREAD2) is (e.g., substantially) equal to VHOLD or greater than the applied read voltages VREAD1 and VREAD2.

For example, as shown in FIG. 2B, a memory cell programmed to a reset state "0" may be switched to a conductive state from a non-conductive state subsequent to VREAD1 (e.g., that is greater than VTH1) applied to the memory cell such that the switched memory cell exhibits VHOLD1, as shown in FIG. 2B. As such, responsive to detecting VHOLD1 across the switched memory cell (e.g., VCELL), a logical state of the memory cell may still be determined to be a reset state "0" (e.g., represented by the voltage distribution 222-2). In contrast, the same memory cell (e.g., programmed to a reset state "0" as shown in FIG. 2B) may not be switched to a conductive state from a non-conductive state subsequent to VREAD2 applied to the memory cell. This is because the threshold voltage VTH2 is greater than VREAD2, as shown in FIG. 2B. As such, the memory cell, as shown in FIG. 2B, may still exhibits sub-threshold voltage (VSD1) whose magnitude is greater than VREAD2, as shown in FIG. 2B.

For example, as shown in FIG. 2C, a memory cell programmed to a set state "1" may be switched to a conductive state from a non-conductive state subsequent to VREAD2 (e.g., that is greater than VTH4) applied to the memory cell such that the switched memory cell exhibits VHOLD2. As such, responsive to detecting VHOLD2 across the switched memory cell (e.g., VCELL), a logical state of the memory cell may still be determined to be a set state "1" (e.g., represented by the voltage distribution 222-3). In contrast, the same memory cell (e.g., programmed to a set state "1" as shown in FIG. 2C) may not be switched to a conductive state from a non-conductive state subsequent to VREAD1 applied to the memory cell. This is because the threshold voltage VTH3 is greater than VREAD1, as shown in FIG. 2B. As such, the memory cell, as shown in FIG. 2B, may still exhibits sub-threshold voltage (VSD2) whose magnitude is greater than VREAD1, as shown in FIG. 2B.

Those characteristics of memory cells such as self-selecting-memory SSM cells can be exploited to perform material implication operations in accordance with embodiments described herein. For example, performing material implication operations may involve applying a positive read voltage (e.g., VREAD2) on one memory cell. Applied VREAD2 may switch a memory cell (e.g., from a non-conductive state to a conductive state) only when the memory cell is programmed to a set state (e.g., as shown in FIG. 2C) while not affecting a logical state of the memory cell regardless its previous logical state (e.g., as shown in FIGS. 2B and 2C). The switched memory cell may affect a word line to which the switched memory cell is coupled, and the affected word line may program, as a result of subsequent signals applied, another memory cell (e.g., coupled to the same word line) to a set state "1" regardless of a previous state of the another memory cell.

Figure 3:
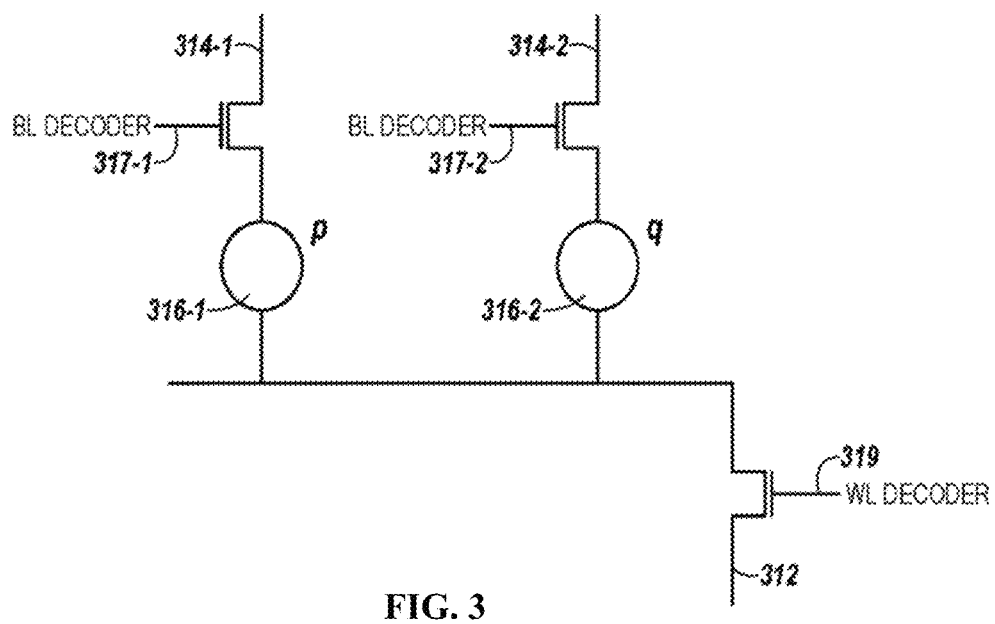
FIG. 3 is a diagram illustrating a portion of a memory array including memory cells capable of storing values associated with a material implication operation in accordance with a number of examples of the present disclosure.

FIG. 3 is a diagram illustrating a portion of a memory array 310 including memory cells 316 capable of storing values associated with a material implication operation in accordance with a number of embodiments of the present disclosure. As illustrated in FIG. 3, memory cells 316-1 and 316-2 (e.g., collectively referred to as memory cells 316) may be coupled to bit lines 314-1 and 314-2 (e.g., collective referred to as bit lines 314), respectively, and to a word line 312. The memory cells 316 may be read and programmed using voltages such as those described in connection with FIGS. 2A-2C.

The bit lines 314 may be utilized for applying respective bit line voltages. For example, a bit line voltage may be applied to the memory cell 316-1 via the bit line 314-1, and another bit line voltage may be applied to the memory cell 316-2 via the bit line 314-2. As such, a bit line voltage for each of the memory cells 316 may be individually controlled (e.g., applying the bit line voltage of the bit line 314-1 may not affect the bit line voltage of the bit line 314-2).

The word line 312 may be utilized for applying a word line voltage. For example, a word line voltage may be applied to the memory cells 316-1 and 316-2 via the same word line 312. Memory array 310 that lacks an external resistor (e.g., load resistor) may be utilized for controlling respective word line voltages of the memory cells 316 at once (e.g., in contrast to controlling each word line voltage at a time).

As shown in FIG. 3, the memory cells 316-1 and 316-2 may be coupled to bit line decoders 317-1 and 317-2, respectively, and to a word line decoder 319. The bit line decoders 317 and the word line decoder 319 may be capable of receiving and decoding address signals to provide accessing the memory array 310. Although not shown in FIG. 3, the decoders 317 and 319 may include drivers (e.g., bit line drivers and/or word line drivers).

As described in connection with FIG. 2, each of the memory cells 316 may switch (e.g., transition) between a non-conductive state and a conductive state. When a memory cell (e.g., one of the memory cells 316) switches from a non-conductive state to a conductive state, a word line voltage may be raised, which would result in lowering VCELL than it would have been had the memory cell not been switched. For example, VCELL may become and remain at VHOLD (e.g., as shown in FIG. 2) when the memory cell switches from a non-conductive state to a conductive state.

In some approaches, memory cells may be coupled to a number of load resistors, and the number of load resistors may limit an impact of the raised word line voltage only to a corresponding memory cell. For example, although the memory cells are coupled to the same word line, corresponding word line voltages of other of the memory cells may not be affected (e.g., raised) even when one of the memory cells switches from a non-conductive state to a conductive state, which results in raising a corresponding word line voltage. Therefore, programming memory cells of a memory array having load resistors may be time-consuming because a respective word line voltage for each memory cell may be controlled individually, which may not suitable for performing material implication operations.

In contrast, the memory array 310 may not include an external resistor (e.g., load resistor) among the memory cells 316. As used herein, the load resistor may be referred to as a resistor external to memory cells and used solely for power consumption without generating signals. For example, the memory cells 316 may be directly coupled to a word line decoder 319 that may generate signals associated with decoding address signals as opposed to a load resistor, which lacks a signal source (e.g., and/or power source). Such a structure may be utilized in performing a material implication operation, which may reduce performance time associated with controlling access line voltages (e.g., word line voltages). Details of how to utilize the memory array 310 in performing a material implication operation are further described in connection with FIGS. 4 and 5.

Figures 4A, 4B:
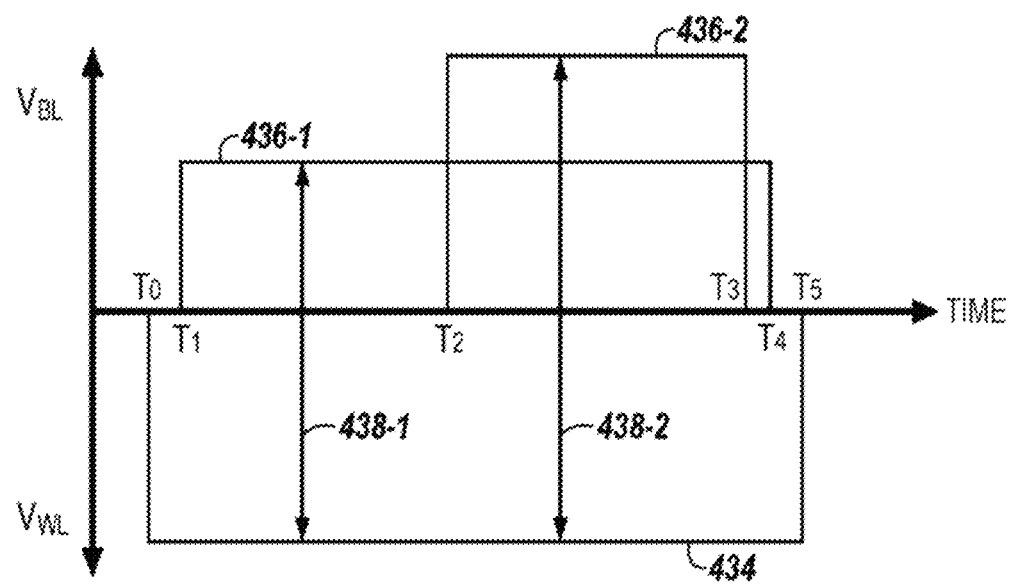
FIG. 4A illustrates a portion of a truth table associated with performing a material implication operation using the applied signals shown in FIG. 4B.
FIG. 4B illustrates a number of signals applied to memory cells in association with performing a material implication operation in accordance with a number of examples of the present disclosure.

FIG. 4A illustrates a portion of a truth table 430 associated with performing a material implication operation using the applied signals shown in FIG. 4B. FIG. 4B illustrates a number of signals 434, 436 applied to memory cells in association with performing a material implication operation in accordance with a number of embodiments of the present disclosure.

Performing a material implication operation may include applying a plurality of signals (e.g., signals 434 and 436) in a particular sequence. In a number of embodiments, a signal may be a squared pulse having a particular polarity and magnitude. As used herein, a squared pulse may be referred to as a pulse whose transitions from one value to another value is substantially instantaneous, as shown in FIG. 4B.

Each of the plurality of signals 434 and 436 may correspond to a voltage to be applied to a respective access line. For example, a signal 434 may correspond to a voltage that may be applied to a word line to which the memory cells "p" and "q" are coupled. For example, a signal 436-1 may correspond to a voltage applied to the bit line to which memory cell "p" is coupled. For example, a signal 436-2 may correspond to a voltage that may be applied to the bit line to which memory cell "q" is coupled. As such, the signal 434 may be referred to as a word line voltage VWL and each of the signals 436 may be referred to as a bit line voltage VBL.

Table 430 shows states of memory cell "p" and memory cell "q" as a result of applying the plurality of signals 434 and 436. For example, columns 431-1 and 431-2 (e.g., of table 430) show states of memory cell "p" and memory cell "q," respectively, prior to applying the plurality of signals 434 and 436. For example, a column 431-3 (e.g., of table 430) shows states of memory cell "q" (e.g., shown as q (pIMPq)) subsequent to applying the plurality of signals 434 and 436.

FIG. 4A-4B assumes (e.g., as shown by column 431-1) that the memory cell "p" is programmed to a reset state (e.g., "0") prior to applying the plurality of signals 434 and 436. The plurality of signals 434 and 436 may be applied in a particular sequence. For example, the signal 434 may be applied for a particular period of time (e.g., T0 to T5), the signal 436-1 may be applied for a particular period of time (e.g., T1 to T4) that is within the period of time for which the signal 434 is being applied, and the signal 436-2 may be applied for a particular period of time (e.g., T2 to T3) that is within the period of time for which the signal 436-1 is being applied.

As shown in FIG. 4B, a voltage corresponding to the signal 436-1 may be less than a voltage corresponding to the signal 436-2. As such, assuming that the word line voltage remains the same from T0 to T5, a voltage differential 438-1 applied across the memory cell "p" at T1 (e.g., until T4) may be less than a voltage differential 438-2 applied across the memory cell "q" at T2 (e.g., until T3). A magnitude of the voltage 438-1 may be equal to (e.g., absolute value of) the read voltage 224 or greater, and a magnitude of the voltage 438-2 may be equal to the program voltage 226 or greater.

When the memory cell "p" is programmed to a reset state (e.g., "0"), the voltage differential 438-1 applied across the memory cell "p" at T1 may not be sufficient to switch (e.g., from a non-conductive state to a conductive state) the memory cell "p" because the memory cell "p" has a threshold voltage (e.g., VTH2, as illustrated in FIG. 2B) that is higher than a read voltage (e.g., VREAD2, as illustrated in FIG. 2B). As such, the voltage applied across the memory cell "p" at T1 does not affect the word line voltage 434.

When the word line voltage 434 remains the same from T0 to T5, a voltage differential 438-2 applied across the memory cell "q" at T3 may be sufficient to switch memory cell q, which would result in programming the memory cell "q" to a set state (e.g., "1"). For example, the memory cell q previously programmed to a reset state (e.g., "0") represented by the voltage distribution 222-2 may be programmed to a set state (e.g., "1") represented by the voltage distribution 222-3. For example, the memory cell q previously programmed to a set state (e.g., "1") represented by the voltage distribution 222-3 may be switched to a conductive state again, which indicates the same state (e.g., represented by the voltage distribution 222-3). Therefore, regardless of a previous state of the memory cell q, the memory cell "q" is programmed to a set state (e.g., "1") as a result of applying the plurality of signals 434 and 436, as shown in the table 430.

Figures 5A, 5B:
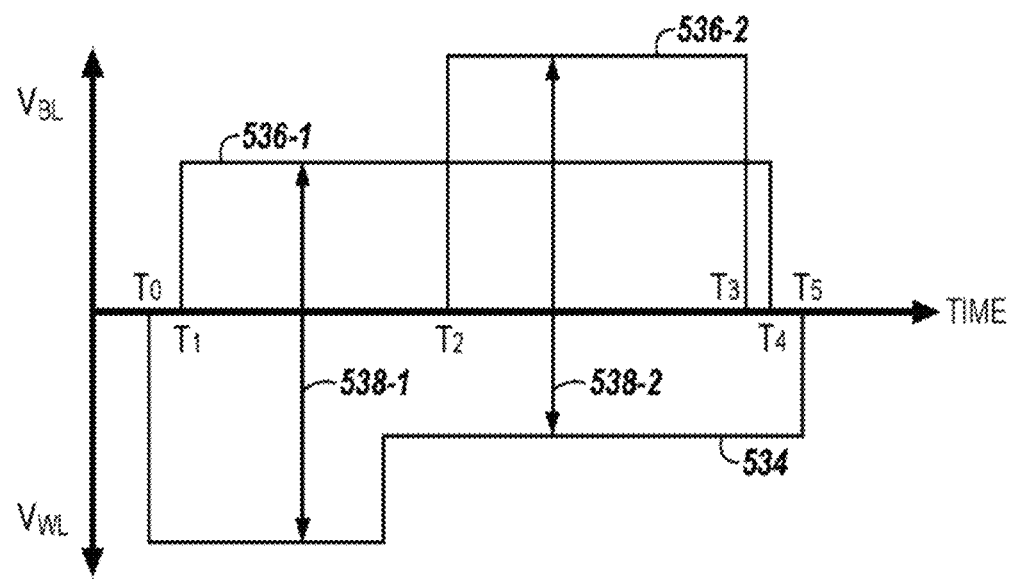
FIG. 5A illustrates a portion of a truth table associated with performing a material implication operation using the applied signals shown in FIG. 5B.
FIG. 5B illustrates a number of signals applied to memory cells in association with performing a material implication operation in accordance with a number of examples of the present disclosure.

FIG. 5A illustrates a portion of a truth table 530 associated with performing a material implication operation using the applied signals shown in FIG. 5B. FIG. 5B illustrates a number of signals 534, 536 applied to memory cells in association with performing a material implication operation in accordance with a number of embodiments of the present disclosure.

Signals 534, 536-1 and 536-2 may be analogous to signals 434, 436-1, and 436-2, respectively, as described in connection with FIG. 4B. For example, a signal 534 may correspond to a voltage that may be applied to a word line (e.g., word line 312) to which the memory cells 316 may be coupled. For example, a signal 536-1 may correspond to a voltage that may be applied to one of bit lines to which one memory cell "p" may be coupled. For example, a signal 536-2 may correspond to a voltage that may be applied to another one of the bit lines to which memory cell "q" may be coupled.

Table 530 shows states of memory cell "p" and memory cell "q" as a result of applying the plurality of signals 534 and 536. For example, columns 531-1 and 531-2 (e.g., of table 530) show states of memory cell "p" and memory cell "q," respectively, prior to applying the plurality of signals 534 and 536. For example, a column 531-3 (e.g., of table 530) shows states of memory cell "q" (e.g., shown as q (pIMPq)) subsequent to applying the plurality of signals 534 and 536.

FIG. 5A-5B assumes that the memory cell "p" is programmed to a set state (e.g., "1") prior to applying the plurality of signals 534 and 536. The plurality of signals 534 and 536 may be applied in a particular sequence, as described in connection with FIG. 4B and shown in FIG. 5B. For example, the signal 534 may be applied (e.g., to a word line to which the memory cells "p" and "q" are coupled) from T0 to T5; the signal 536-1 may be applied (e.g., to a bit line to which the memory cell "p" is coupled) from T1 to T4 (e.g., while the signal 534 is being applied), and the signal 536-2 may be applied (e.g., to a bit line to which the memory cell "q" is coupled) from T2 to T3 (e.g., while the signal 536-1 is being applied).

As shown in FIG. 5B, a voltage differential 538-1 may not be less than a voltage differential 538-2. Unlike the scenario described in connection with FIG. 4A-4B (e.g., in which the memory cell "p" is previously programmed to a reset state (e.g., "0")), the memory cell "p" that is programmed to a set state (e.g., "1") has a threshold voltage that is less than a read voltage. For example, the voltage differential 538-1 applied across the memory cell "p" is sufficient to switch the memory cell "p" to a different state (e.g., non-conductive state to a conductive state), as described in connection with FIG. 2B and FIG. 2C. As such, at some point subsequent to T1, the word line voltage (VWORD) is raised due to the switching event of the memory cell p. The raised VWORD may reduce the voltage differential 538-2 (e.g., voltage applied across the memory cell "q" at T3). For example, even if the bit line voltage 564-2 (e.g., applied on the memory cell "q") may be the same voltage as the bit line voltage 464-2, the voltage differential 538-2 across the memory cell "q" from T3 to T4 may be reduced because VWORD is raised. The voltage differential 538-2 reduced compared to the voltage differential 438-1 may correspond to a magnitude of the read voltages 224.

The reduced voltage differential 538-2 may not change a logical state of the memory cell "q". For example, when the memory cell "q" is previously programmed to a reset state (e.g., represented by the voltage distribution 222-4), a threshold voltage (e.g., VTH2) of the memory cell "q" is greater than the reduced voltage differential 538-2 (e.g., VREAD2), and the memory cell "q" may remain in the same state (e.g., reset state). For example, when the memory cell "q" is previously programmed to a set state (e.g., represented by the voltage distribution 222-1), a threshold voltage (e.g., VTH4) of the memory cell "q" is less than the reduced voltage differential 538-2, and the reduced voltage differential 538-2 may switch the memory cell "q" from a non-conductive state to a conductive state (e.g., 222-3) again, which indicates the same state (e.g., a set state "1").

As shown in FIGS. 4A and 5A, as a result of applying of the plurality of signals (e.g., 434 and 436 and/or 534 and 536) a state of the memory cell "q" may be changed (e.g., from a reset state "0" to a set state "1") only when the memory cell "p" has been programmed to a reset state. Given that a value stored (e.g., as show in column 531-1) on the memory cell "p" is an antecedent and a value stored (e.g., as shown in column 531-2) on the memory cell "q" is a consequent (e.g., of the material implication operation), a resulting state of the memory cell "q" (e.g., as shown in column 531-3) corresponds to a result of the material implication operation. Stated differently, applying the plurality of signals in the particular sequence, as illustrated herein, on a memory array (e.g., memory array 310) may result in performing a material implication operation whose result may be stored on one of memory cells (e.g., memory cell "q") whose previous stored value has been used as a consequent. Similarly, by performing a number of material implication operations, a memory array (e.g., memory array 110) may be configured to perform Boolean logical operations such as NOT, NAND, NOR, COPY, and/or XOR, among others.

In a number of embodiments, material implication operations may be performed without transferring values associated with the material implication operations from a memory array (e.g., memory array 110). For example, the material implication operations may be performed without reading and/or storing those values such as antecedent and/or consequent in a different storage location (e.g., sense amplifier, latch, etc.). As such, embodiments of the present disclosure provide benefits such as reducing power consumption as compared to previous approaches which may involve transferring operands of material implication operations to sensing circuitry (e.g., during read operations).

In the following lines it will be discussed the parallel execution of an IMP operation applied on a 3D memory array.

General speaking, it is possible to exchange BL and WL to perform the IMP operation on bits sharing the same BL or the same WL, but in the following description we will focus our attention on the case where p and q are sharing the same WL even if the disclosed example should not be considered as limiting the Applicant's rights.

Figure 8:
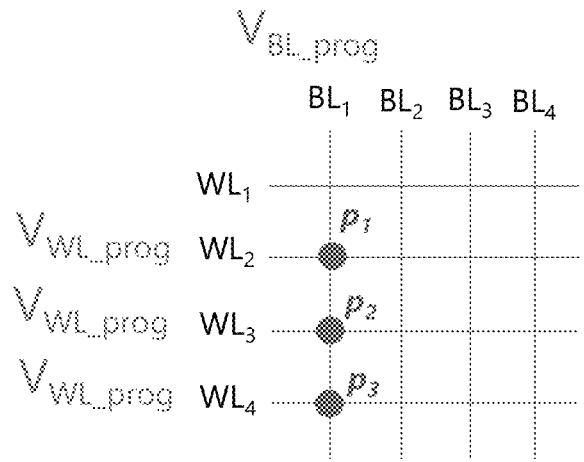
FIG. 8 shows a schematic example of a duplication operation where the input data p is copied twice to implement a triple-modular-redundancy.
Figure 9:
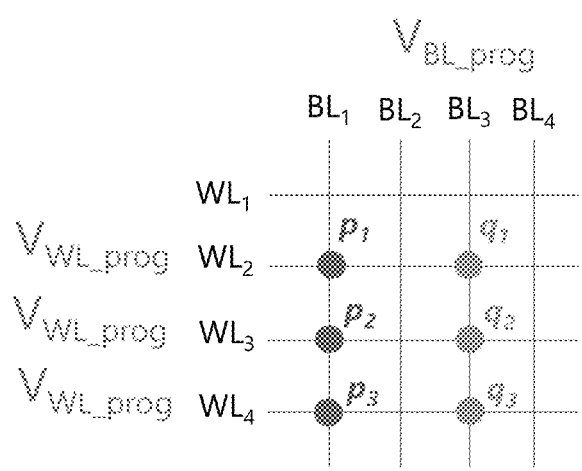
FIG. 9 shows a schematic example of how a program operation can be performed in parallel on more than one bit per memory tile.

In a situation where p and q are sharing the same WL, one single IMP operation at a time is executed. However, the schematic examples of the FIGS. 8 and 9 show IMP operations performed on 1 bit per tile and on three bits per tile, respectively.

Figure 6:
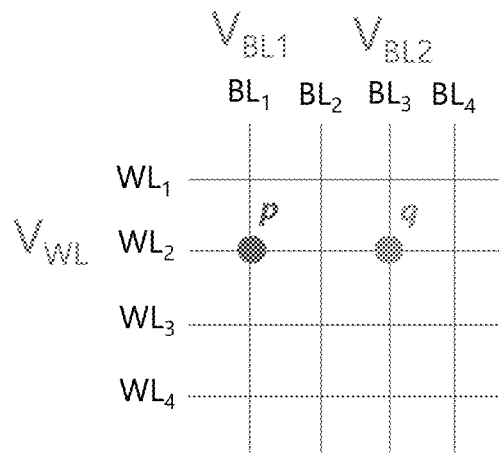
FIG. 6 illustrates in a scheme how it is possible to execute a single material implication IMP operation on a bit sharing the same word line.

FIG. 6 illustrates how it is possible to execute a single IMP operation on a bit sharing the same word line WL2.

Figure 7:
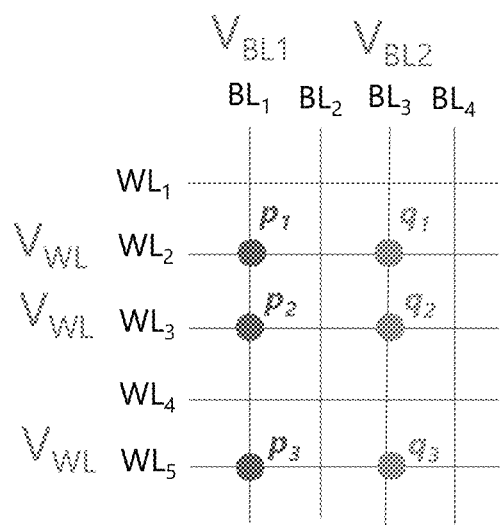
FIG. 7 illustrates in a scheme how it is possible to execute several material implication IMP operations in parallel if different word lines are used.

FIG. 7 illustrates how it is possible to execute several IMP operations in parallel if different WLs are used (even not contiguous), while BL1 and BL3 are the same of the previous example. An assumption in this last case is that the BL voltage is marginally affected by the switching of bits along this BL. Depending on the decoder architecture, the voltage reduction after switching can move the WL side only, leaving the BL side unaffected, or viceversa. Alternatively or additionally, the array may be designed to have a lower resistance associated with the bit lines than a resistance associated to the word lines; for example, bit lines may be wider and/or thicker than word lines, they may include a material that is less resistive, etc. If the voltage drop is mainly happening on the BL side, the role of the BL and WL can be exchanged.

Coming now more specifically to the methodology of the present disclosure, it may be appreciated how it is possible to provide a Triple-Modular-Redundancy IMP operation or, said differently, a TMR-IMP implementation in 3D vertical memory devices.

First of all, a TMR can be easily implemented in 3D memories by copying each data three times along the same Bit Line on three different Word Lines.

FIG. 8 shows a schematic example of such a duplication where the input data p is copied twice to implement the TMR. The copy phase is obviously a standard programming phase for set or reset state.

In this FIG. 8 the data p are sharing the same Bit Line BL1 and the example reports three values copied on cells at crossing of BL1 with the three different Word Lines WL2, WL3 and WL 4. The result is therefore that: $p_1=p_2=p_3$. For simplicity we may assume that the W Ls are contiguous, but it may not strictly required. Similarly as described with reference to data p, also data q (e.g., present in the cell at crossing of BL3 and WL2—shown in FIG. 9) may be copied to cells at crossing of same bit line BL3 and different word lines, e.g., WL3 and WL4, resulting in and $q_1=q_2=q_3$.

The obvious drawbacks of TMR is the large storage space overhead, but such penalty is usually considered acceptable in traditional fault-tolerant implementations, where entire logical subsystem are triplicated. The penalty in term of performances is usually a minor issue and classical TMR implementation with majority voters is usually faster than standard ECC encoding/decoding based on Hamming code.

As shown in the example of FIG. 9, the program operation can be performed in parallel on more than one bit per memory tile, so that for instance the three copies of the same data $p_1,p_2,p_3$ and $q_1,q_2,q_3$ can be programmed simultaneously in the array. By combining the parallel programming reported in FIG. 9 with the parallel execution of the IMP operations as in FIG. 7 on the three copies of the same datum, it is possible implementing a triple-modular-redundancy while implementing a material implication operation pIMPq (TMR-IMP).

Figures 10, 11:
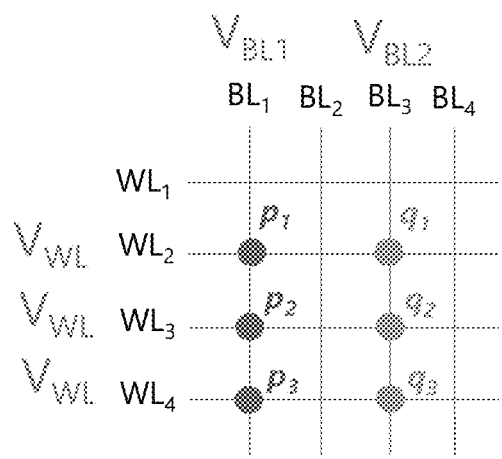
FIG. 10 shows a schematic example of a material implication operation performed in parallel on more than one bit per memory tile.
FIG. 11 shows a table reporting the final result of the material implication operation.

The final parallel execution of the material implication pIMPq operation is schematically reported in FIG. 10.

After the execution of a pIMPq operation with the TMR scheme, the expected result should be that the three bits q1, q2 and q3 have the same logical values resulting from the pIMPq operation. However, an error can happen during the programming operation of the input data pi and qi or during the execution of the IMP operation. The error probability is expected to be relatively small (e.g., in the range from 1e-6 to about 1e-4), however this value is usually not acceptable in logic operations.

Conventional TMR uses a majority logic gate to decide which of the three outputs qi is the correct output. The majority gate output is "1" if two or more of the inputs qi of the majority gate are "1". On the contrary, the output is "0" if two or more of the majority gate's inputs qi are 0. This is reported in the table shown in FIG. 11.

Conventional TMR can be implemented by reading the three bits qi, then applying a majority logic gate and finally correcting the wrong bit through a re-program operation; however, this is not an IMC operation.

The present disclosure proposes to adopt a methodology using a smart TMR algorithm that implements a majority voting scheme inside the array, i.e., without reading the content of bits qi, and then corrects the wrong bit (if present)

rebuilding the integrity of the three copies of the data used in TMR with an IMC operation.

This TMR algorithm is based on a sequence of four pulses disclosed in following paragraphs combined with a current comparator circuit placed on the selected BL that can trigger or skip the application of the third and fourth pulse in the sequence.

A snap detection circuit placed along the word line WL can be further exploited to avoid the overwrite (Set-on-Set or Reset-on-Reset) operations.

Let's now see in more details how this methodology is implemented in a 3D memory array.

First of all, a dual polarity pulse sequence with snap detector will be disclosed.

Figure 12:
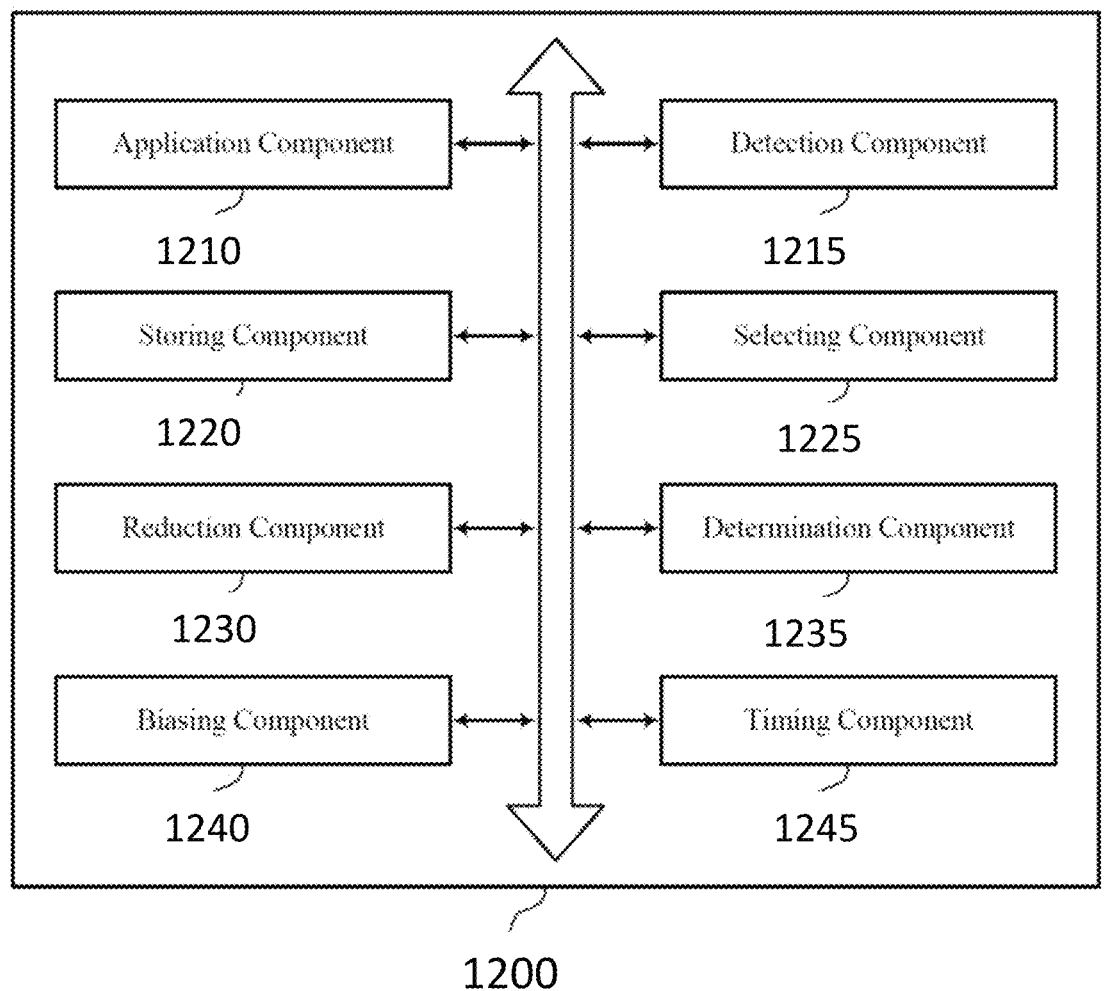
FIG. 12 shows a block diagram of an apparatus that supports techniques for programming a memory cell in accordance with examples of the present disclosure.

FIG. 12 shows a block diagram of an apparatus 1200 that supports techniques for programming a memory cell in accordance with examples of the present disclosure. The apparatus 1200 or snapback event detector may be an example of aspects of a memory controller (e.g., controller 102 as described with reference to FIG. 1). The snapback event detector may include application component 1210, detection component 1215, storing component 1220, selecting component 1225, reduction component 1230, determination component 1235, biasing component 1240, and timing component 1245. Each of these components may communicate, directly or indirectly, with one another (e.g., via one or more buses).

Application component 1210 may apply, during a write operation, a first pulse having a first polarity to a memory cell storing a first logic state. In some examples, application component 1210 may apply a second pulse having a second polarity different than the first polarity to the memory cell in response to detecting the snapback event. In some examples, application component 1210 may apply a first voltage to a first access line coupled with the memory cell. In some examples, application component 1210 may apply a second voltage to a second access line coupled with the memory cell, where applying the first pulse is based at least in part on applying the first voltage and the second voltage.

In some examples, application component 1210 may apply the second voltage to the first access line. In some examples, application component 1210 may apply the first voltage to the second access line, where applying the second pulse is based at least in part on applying the first voltage to the second access line and the second voltage to the first access line. In some examples, application component 1210 may apply the second pulse to the memory cell during the duration when the threshold voltage is reduced. In some examples, application component 1210 may apply, during a write operation, a first pulse having a first polarity to a memory cell storing a first logic state. In some examples, application component 1210 may apply a first voltage to a first access line coupled with the memory cell. In some examples, application component 1210 may apply a second voltage to a second access line coupled with the memory cell, where applying the first pulse is based at least in part on applying the first voltage and the second voltage.

In some examples, application component 1210 may apply, during the duration, a second pulse to the memory cell during the write operation, the second pulse having a second polarity different than the first polarity. In some examples, application component 1210 may apply a first pulse having a voltage across the memory cell in a first direction and a second pulse having a voltage across the memory cell in a second direction. In some examples, application component 1210 may apply, during a write operation, a first pulse having a first polarity to the memory cell. In some examples, application component 1210 may apply a second pulse having a second polarity different than the first polarity to the memory cell in response to detecting the snapback event.

In some examples, application component 1210 may apply the second pulse having the second polarity by applying a voltage to the second access line, the voltage being greater than the reduced threshold voltage. In some examples, application component 1210 may apply the first pulse having the first polarity to the memory cell during a duration. In some examples, application component 1210 may apply the first pulse having the first polarity by applying a first voltage to the first access line. In some examples, application component 1210 may apply the second pulse having the second polarity by applying a second voltage to the second access line, where writing the second logic state to the memory cell is based at least in part on a magnitude of the second voltage exceeding a threshold voltage of the memory cell.

Detection component 1215 may detect a snapback event at the memory cell in response to applying the first pulse. Detection component 1215 may detect a reduction in a magnitude of a voltage across the memory cell, where detecting the snapback event is based at least in part on detecting the reduction in the magnitude of the voltage. Detection component 1215 may detect the snapback event based at least in part on a value of the first logic state being different than the value of the second logic state to be stored to the memory cell. Detection component 1215 may detect a second snapback event at the memory cell in response to applying the second pulse to the memory cell after the duration.

Detection component 1215 may detect the first logic state stored by the memory cell in response to applying the first pulse to the memory cell. Detection component 1215 may detect the first logic state based at least in part on a threshold voltage of the memory cell being less than a magnitude of the first pulse. Detection component 1215 may detect the first logic state during a duration after applying the first pulse, and where the second logic state is written to the memory cell during the duration. In some examples, detection component 1215 may detect the snapback event at the memory cell during a duration after applying the first pulse. Detection component 1215 may detect the first logic state during the duration and the second logic state is written to the memory cell during the duration.

Storing component 1220 may store a second logic state different than the first logic state in the memory cell based at least in part on applying the second pulse to the memory cell. In some examples, storing component 1220 may store a second logic state in the memory cell by applying a second pulse having a second polarity during the write operation in response to detecting the first logic state, where the second logic state is different than the first logic state. Storing component 1220 may store the second logic state to the memory cell based at least in part on a threshold voltage of the memory cell being reduced for a duration. In some examples, storing component 1220 may store a second logic value in the memory cell after applying the second pulse.

Selecting component 1225 may select a voltage magnitude of the first pulse based at least in part on a value of the second logic state to be stored to the memory cell. In some examples, selecting component 1225 may select the first pulse from a plurality of pulses based at least in part on a value of the second logic state to be written to the memory cell.

Reduction component 1230 may reduce, for a duration, a threshold voltage of a memory cell during a write operation by applying a first pulse to the memory cell having a first polarity, the memory cell including a first logic value. In some examples, reduction component 1230 may reduce, after the duration, the threshold voltage of the memory cell during the write operation by applying the first pulse to the memory cell having the first polarity, the memory cell including the second logic value.

Determination component 1235 may determine the first logic value of the memory cell based at least in part on reducing the threshold voltage of the memory cell during the write operation.

Figure 13:
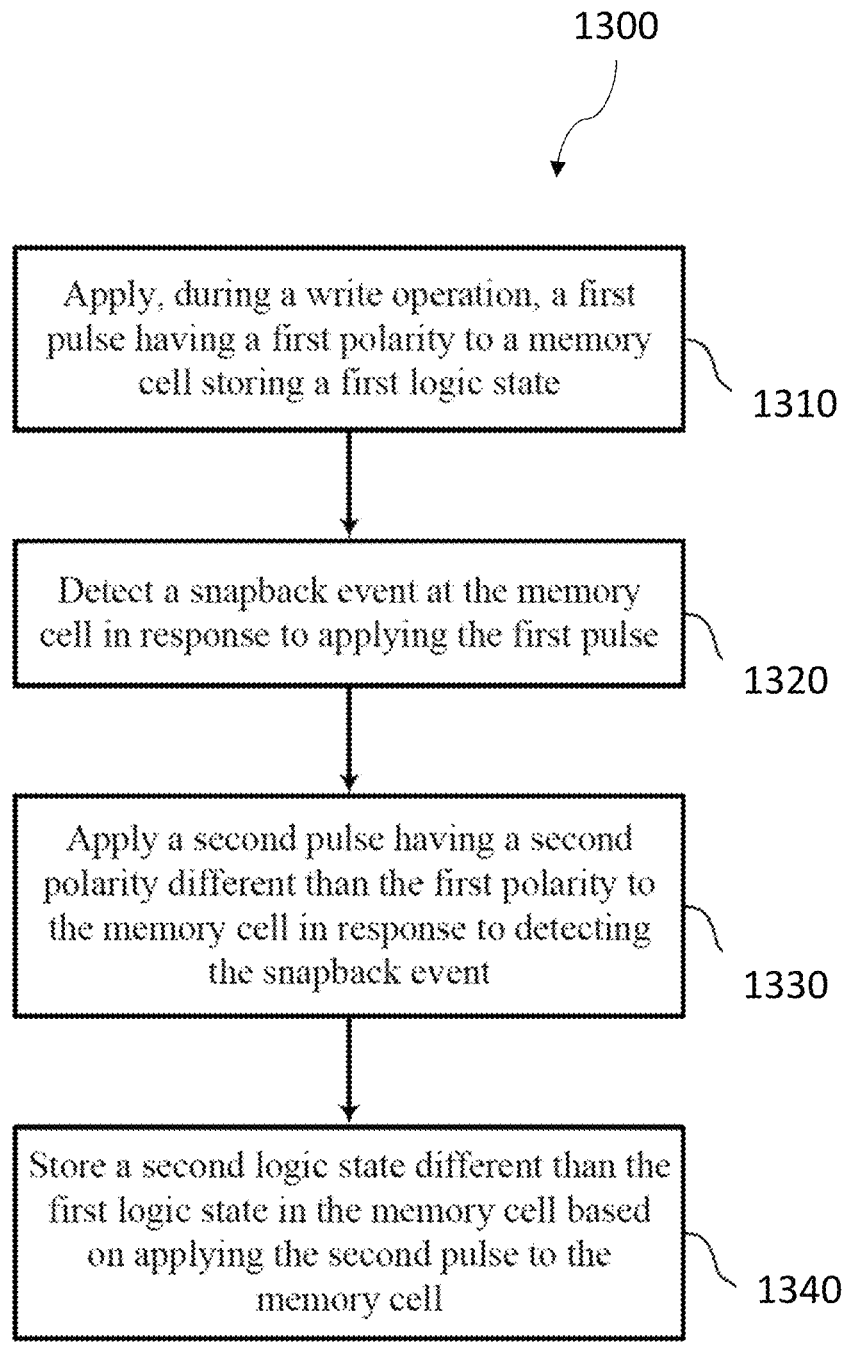
FIG. 13 shows a flowchart illustrating a method that supports techniques for programming memory cell in accordance with aspects of the present disclosure.

FIG. 13 shows a flowchart illustrating a method 1300 that supports techniques for programming memory cell in accordance with aspects of the present disclosure. The operations of method 1300 may be implemented by a memory controller or its components as described herein. For example, the operations of method 1300 may be performed by a snapback event detector as described with reference to FIG. 12. In some examples, a memory controller may execute a set of instructions to control the functional elements of the snapback event detector to perform the functions described below. Additionally or alternatively, a memory controller may perform aspects of the functions described below using special-purpose hardware.

At 1310, the memory controller may apply, during a write operation, a first pulse having a first polarity to a memory cell storing a first logic state. The operations of 1310 may be performed according to the methods described herein. In some examples, aspects of the operations of 1310 may be performed by an application component as described with reference to FIG. 12.

At 1320, the memory controller may detect a snapback event at the memory cell in response to applying the first pulse. The operations of 1320 may be performed according to the methods described herein. In some examples, aspects of the operations of 1320 may be performed by a detection component as described with reference to FIG. 12.

At 1330, the memory controller may apply a second pulse having a second polarity different than the first polarity to the memory cell in response to detecting the snapback event. The operations of 1330 may be performed according to the methods described herein. In some examples, aspects of the operations of 1330 may be performed by an application component as described with reference to FIG. 12.

At 1340, the memory controller may store a second logic state different than the first logic state in the memory cell based on applying the second pulse to the memory cell. The operations of 1340 may be performed according to the methods described herein. In some examples, aspects of the operations of 1340 may be performed by a storage component as described with reference to FIG. 12.

Figure 15:
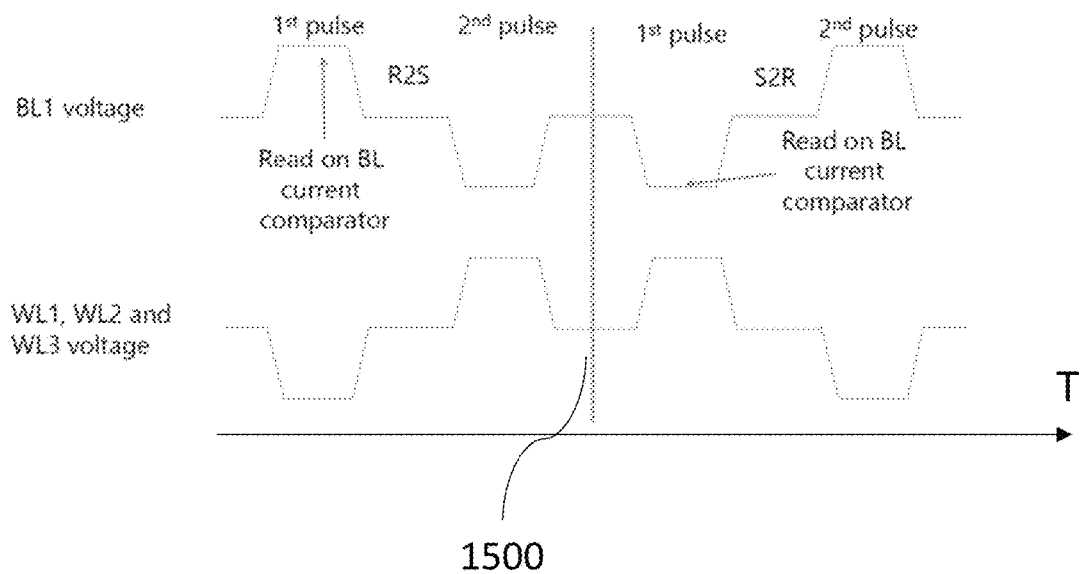
FIG. 15 shows a schematic diagram of the voltage pulses versus time applied to the bit line of the example of FIG. 14 and the corresponding voltage values on the word lines.

The programming method disclosed with reference to FIG. 15 may be summarized in an algorithm including two pulses with opposite polarities.

A first initial pulse is substantially used for detecting the state of the cell while the second pulse is a programming pulse with the correct polarity. We will refer hereinafter to this double pulses as a dual polarity like algorithm.

The snap detector circuit can be activated during the first pulse to detect the status of the cell and in case skip the second pulse (to avoid Set-on-Set or Reset-on-Reset operation).

In view of the above considerations, according to embodiments of the present disclosure the dual-polarity-like algorithm is applied to target 3D memory cells so that the sequence of operations are identified as R2S and S2R (depending on the polarity of the first pulse, e.g., positive first pulse for R2S and negative for S2R) and are applied in sequence along the selected bit lines BL and in parallel on the three selected word lines WLs.

The order of application of the R2S and S2R operations can be reverted, i.e. S2R first and R2S later.

Therefore, according to embodiments of the present disclosure, the proposed solution relates to a method for improving the fault-tolerant capability of memory devices applying a triple-modular-redundancy calculation in a programming phase of the memory cells of a memory array and adopting a sequence of two opposite dual-polarity algorithms, i.e. a sequence including a R2S and S2R operations, or viceversa, applied along a selected Bit Line and in parallel on the at least three selected Word Lines of the memory array. The sequence of two opposite dual-polarity algorithms corresponds to an TMR implementation, thus being able to detect any mismatch between the content of one bit with respect to the other two and then restoring the content of the three bits to be the same and in accordance with the results of a majority voter scheme.

Focusing now on the first of the two dual-polarity algorithms (e.g., the R2S part), during the first pulse, in this disclosure a current mirror at selection current Isel is activated on each selected WL to limit to Isel the current flowing through each cell if snapped.

The current flowing through the BL will depend on how many bits switches during the first pulse, thus being 0 or a multiple of the selection current Isel.

The current flowing through the selected BL is sent to a current comparator circuit.

If the current flowing though the BL is less than 2*Isel, then the second phase of the dual polarity algorithm is applied.

If the current flowing though the BL is greater than or equal to 2*Isel, then the second phase of the dual polarity algorithm is skipped.

The same strategy is applied during the application of the second dual polarity algorithm (e.g., the S2R).

Figure 14:
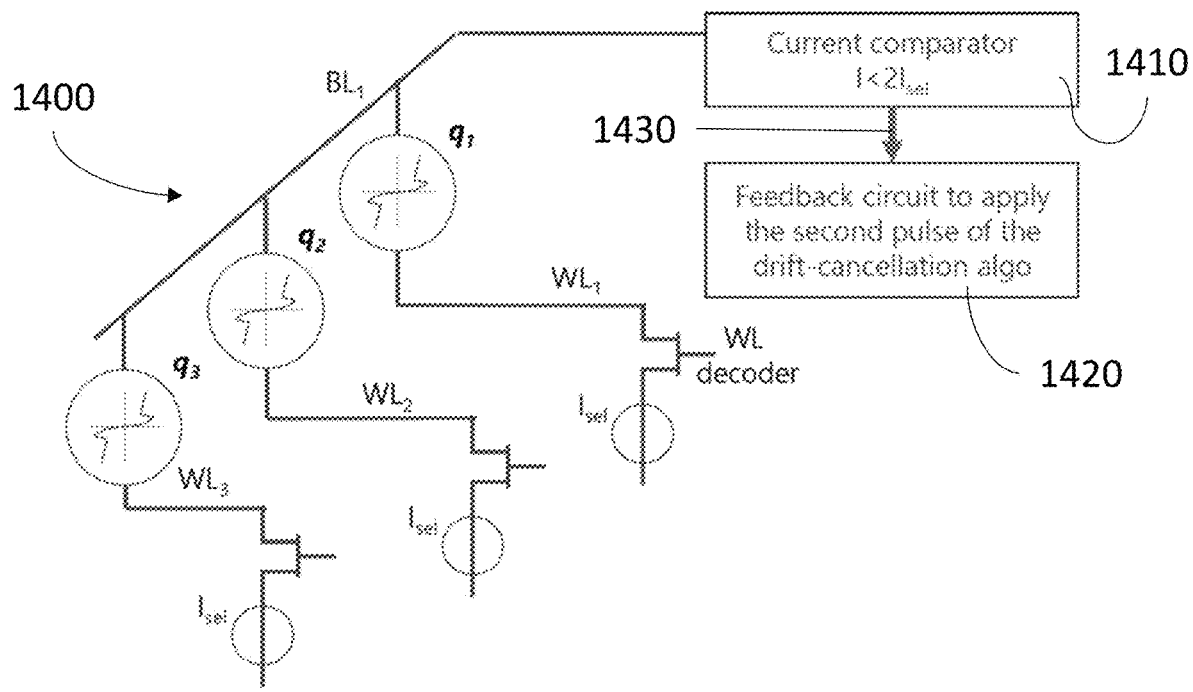
FIG. 14 illustrates a portion of a 3D memory array that can be operated to perform material implication operations in accordance with a number of examples of the present disclosure.

FIG. 14 illustrates a schematic example of a portion 1400 of the memory array including few memory cells coupled to a bit line or digit line BL1 and to respective word lines WL1, WL2, WL3. The cells contain logic data, for instance q1, q2 and q3.

A dedicated circuitry 1410 is provided based on a current comparator and connected to the BL to sense the number of possible snapped cells. This circuitry 1410 may be considered a snap detector.

This circuitry 1410 is coupled to a feedback circuit 1420 that is provided to apply the second pulse of the dual polarity algorithm.

If the current flowing through the bit line BL1 during the first pulse of a dual polarity algorithm is minor than 2*Isel, then the circuitry 1410 issues a signal 1430 for the feedback circuit 1420 allowing to send the second pulse, otherwise this phase is skipped.

Other snap detectors (not shown) are provided along and in association with the word lines.

The information provided by a snap-detectors placed along the WLs can be used to selectively apply the second pulse just to one of the three word lines WL1, WL2 or WL3 that may be corrected.

After the possible snap-back events and the fast transient related to the transition in the ON-state, the selected bit line BL recovers a quite stable voltage that is close to the forced one.

The current flowing through each snapped cell is fixed by a clamp device. The total bit line current is a multiple of the I_cell forced by the clamp device in each cell and related to how many cells of the three selected are snapped.

A current comparator reads the current flowing through the bit line BL1.

For example, a small resistance can be placed in series between the decoded bit line BL1 and the BL1 voltage source and the differential voltage across this resistor can be read and compared to a reference value.

FIG. 15 shows a schematic diagram of the voltage pulses versus time applied to the bit line BL1 of the example of FIG. 16 and the corresponding voltage values on the word lines WL1, WL2 and WL3.

As it may be appreciated, the first pulse of the first sequence R2S is applied on the bit line BL1 and is read by the circuitry 1410 or snap detector. The second subsequent pulse has opposite polarity.

The first dual polarity algorithm, R2S, terminates in correspondence of the dotted separation line 1500 after which the second dual polarity algorithm, S2R, starts with the application of a first pulse having the same polarity of the second pulse of the first algorithm followed by a second pulse having opposite polarity.

Therefore, the triple modular redundancy method of the present disclosure includes a sequence of dual polarity algorithms S2R and R2S (with the order that can be inverted) where the bit line BL current comparator is used to skip or deliver the 2nd pulse of each algorithm. A snap detector along each WL can be used to further increase the granularity of the skipping or delivering of the 2nd pulse of the algorithm to each WL.

The FIGS. 16 and 17 represent comparison tables reporting the differences between a triple modular redundancy applied alone, that is to say without the snap detector along the WL, and a triple modular redundancy associated with a snap detector on the WL, both adopted in 3D memory devices together with the dual polarity algorithms of present disclosure.

In FIG. 16 the first input columns represent three bits of a triple modular redundancy TMR computation.

The following R2S columns represent the first part of the TMR algorithm sequence.

The BL1 current represents the current detected along the selected bit line BL; this current value depends on how many of the three bits are snapping during the first pulse of the dual polarity algorithm (i.e., on the number of bits in state 0).

The 2nd pulse column indicates if the second pulse is applied or not (Y/N) and to which word line WL1, WL2 or WL3 in case the snap detector is activated along the word lines WLx (Y-WLx/N).

The intermediate columns represent the status of the three input bits after the application of the first dual polarity algorithm R2S.

The S2R column represents the application of the second part of the TMR algorithm sequence. The BL1 column and the 2nd pulse column of this table portion are similar in meaning to those the R2S columns.

Finally, the output column represents the final or corrected status of the three input bits.

FIG. 17 is substantially identical in shape and structure to FIG. 16 but reports the data of the TMR algorithms associated with the snap detection.

The method of the present disclosure has many advantages because it works with the same voltage applied in standard 3D vertical cross point memory devices and with algorithms (i.e. dual polarity based algorithms) that are compatible with those kind of memory devices.

Moreover, the disclosed method may be considered an IMC operation allowing to reconstruct the data in the middle of a complex computation without reading and processing the data with an external logic. The smart TMR algorithm is capable to refresh and correct the internal status of the memory without implementing a complex external majority voter gate and associated circuitry as used in conventional TMR.

Depending on the error probability of the IMP operation, a suitable frequency for the application of the disclosed method can significantly lower the final error probability.

Figure 18:
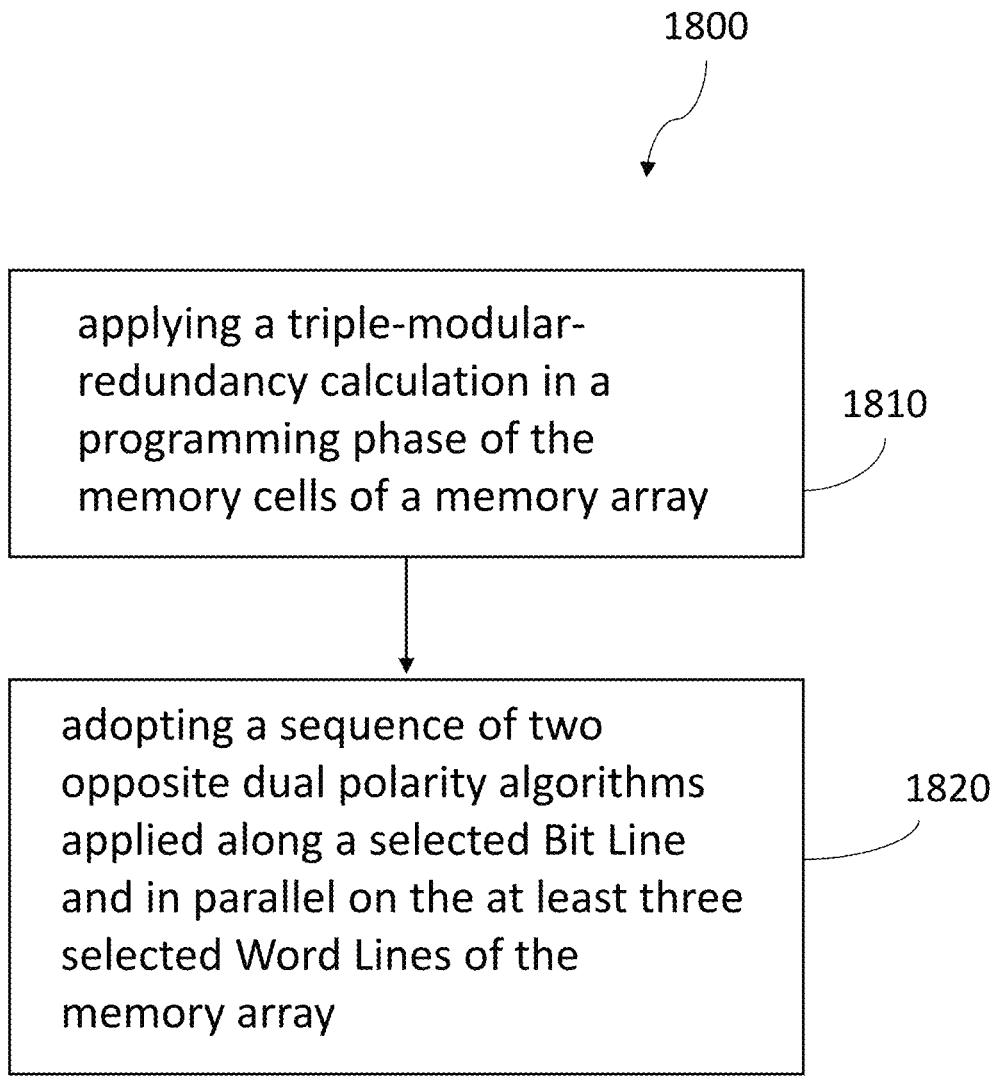
FIG. 18 shows a flowchart illustrating a method that supports techniques for programming memory cell in accordance with aspects of the present disclosure.

FIG. 18 shows schematically in a diagram the phases of the method of the present disclosure.

The diagram 1800 reports the two phases for improving the fault-tolerant capability of memory devices; in particular, 3D memory devices including an array of memory cell configured in levels of word lines interconnected by bit lines.

A first step 1810 consists in applying a triple-modular-redundancy calculation in a programming phase of the memory cells of a memory array.

A second step 1820 includes adopting a sequence of two opposite dual polarity algorithms applied along a selected Bit Line and in parallel on the at least three selected Word Lines of the memory array.

The sequence of two opposite dual polarity algorithms is a sequence including a R2S and S2R operations, or vice-versa, applied along a selected Bit Line and in parallel on the at least three selected Word Lines of the memory array.

All in all, the method of the present disclosure allows performing a triple in-memory computing calculation in parallel adopting a refresh algorithm combining a sequence of opposite polarity (R2S and S2R) dual polarity algorithm applied in parallel on three different word lines and coupled with a specific feedback logic.

Both algorithms (program and refresh) and added circuitry (i.e. the Bit Line current comparator) are specifically configured in the 3D memory device and corresponding on-board or external controller.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing detailed description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment.

Thus, the following claims are hereby incorporated into the detailed description, with each claim standing on its own as a separate embodiment

What is claimed is:

1. A method for improving a fault-tolerant capability of memory devices, comprising:
   applying a triple-modular-redundancy calculation in a programming phase of memory cells of a memory array; and
   adopting a sequence of two opposite dual polarity algorithms applied along a selected bit line and in parallel on at least three selected word lines of the memory array.

2. The method of claim 1, wherein a majority voting scheme is implemented by correcting wrong bits and rebuilding an integrity of copies of data used in the triple-modular-redundancy calculation during in-memory computing operations.

3. The method of claim 1, wherein each dual polarity algorithm comprises two pulses with respective polarities:
   a first pulse used for detecting a cell state of a memory cell; and
   a second pulse with a correct polarity for data programming.

4. The method of claim 3, wherein a snap detector circuit is activated during the first pulse of each dual polarity algorithm in the sequence to detect the cell state of the memory cell and in case skip the second pulse of the dual polarity algorithm.

5. The method of claim 1, wherein a current flowing through the selected bit line is checked by a current comparator circuit, and for each dual polarity algorithm:
   if the current flowing through the selected bit line is less than a threshold reference current, then a second pulse of the dual polarity algorithm is applied;
   if the current flowing through the selected bit line is greater than or equal to the threshold reference current, then the second pulse of the dual polarity algorithm is skipped.

6. The method of claim 5, wherein a phase of checking and comparing a value of the current flowing through the selected bit line is applied to the dual polarity algorithms.

7. The method of claim 1, wherein the sequence of two opposite dual polarity algorithms is a sequence comprising an R2S operation and an S2R operation, applied along the selected bit line and in parallel on the at least three selected word lines of the memory array.

8. The method of claim 1, wherein each dual polarity algorithm comprises:
   applying a first pulse having a first polarity to a memory cell storing a first logic state;
   detecting a snapback event at the memory cell in response to applying the first pulse;
   applying a second pulse having a second polarity different than the first polarity to the memory cell in response to detecting the snapback event; and
   storing a second logic state different than the first logic state in the memory cell based at least in part on applying the second pulse to the memory cell.

9. The method of claim 8, further comprising:
   applying a first voltage to a first access line coupled with the memory cell; and
   applying a second voltage to a second access line coupled with the memory cell, wherein applying the first pulse is based at least in part on applying the first voltage and the second voltage.

10. The method of claim 9, further comprising:
    applying the second voltage to the first access line; and
    applying the first voltage to the second access line, wherein applying the second pulse is based at least in part on applying the first voltage to the second access line and the second voltage to the first access line.

11. The method of claim 1, wherein a memory device of the memory devices is a 3D vertical cross point memory device configured for performing in-memory computing (IMC) operations.

12. The method of claim 1, further comprising:
    performing a material implication operation on values stored on one and another of a plurality of memory cells coupled to a first access line by applying a plurality of material implication signals in a particular sequence on the one and the another of the plurality of memory cells.

* * * * *